United States Patent [19]

Remondiere et al.

[11] Patent Number: 4,880,960
[45] Date of Patent: Nov. 14, 1989

[54] CONTINUOUS VACUUM EVAPORATION DEVICE FOR METAL

[75] Inventors: Olivier Remondiere, Ramonville St Agne; Patrick Bourquin, Merignac; René Pailler, Cestas, all of France

[73] Assignee: Centre National d'Etudes Spatiales, Paris, France

[21] Appl. No.: 165,079

[22] Filed: Mar. 7, 1988

[30] Foreign Application Priority Data

Mar. 6, 1987 [FR] France .................. 87 03092

[51] Int. Cl.[4] .............................. C23C 14/26
[52] U.S. Cl. ......................... 219/273; 118/726
[58] Field of Search .............. 219/271, 273, 275; 427/50, 51, 52, 49; 118/726, 727, 50.1

[56] References Cited

U.S. PATENT DOCUMENTS

| | | | |
|---|---|---|---|
| 2,793,609 | 5/1957 | Shen | 219/271 |
| 3,271,562 | 9/1966 | Roberts | 118/726 |
| 3,563,202 | 2/1971 | Mackrael | 219/271 |
| 4,395,179 | 7/1983 | Berzins | 414/161 |

FOREIGN PATENT DOCUMENTS

| | | |
|---|---|---|
| 2030688 | 1/1971 | Fed. Rep. of Germany . |
| 1069111 | 7/1954 | France . |
| 2456144 | 12/1980 | France . |
| 900205 | 7/1962 | United Kingdom ............ 219/271 |

Primary Examiner—Teresa J. Walberg
Attorney, Agent, or Firm—Nixon & Vanderhye

[57] ABSTRACT

A substrate to be coated moves within a vacuum chamber. A deposition material in particle form is stored in a reservoir closed on its lowermost part by a plate. A cable links the plate to a valve which closes the supply opening of a crucible heated to a temperature for evaporation of the deposition material. A control device using at least one electromagnet allows the plate to pivot and thus to open the valve. A quantity of powder falls into the crucible, then the plate and the valve are returned to closed position. A screen with a mesh having dimensions smaller than those of the deposition material particles in the crucible allows passage of the vapor only and subsequent deposition onto the substrate. The invention is particularly useful in the manufacture of carbon fibers coated with magnesium.

7 Claims, 2 Drawing Sheets

CONTINUOUS VACUUM EVAPORATION DEVICE FOR METAL

BACKGROUND OF THE INVENTION

1. Field of the Invention

The present invention generally relates to the field of vacuum evaporation of metals and more particularly to those cases where this operation is to be done continuously in order to coat a continuous substrate, such as a wire or strip.

2. Description of the Prior Art

Deposition, co-deposition, coating, or protection can all be obtained by processes such as condensation or ionic plating. These techniques are used in the deposition of metals in the vapor phase and apply to many areas such as microelectronics, coating of plastics, protection of metal parts against corrosion or the manufacture of composite materials.

The evaporator sources are generally static, i.e., the metal present at the beginning is the source and is partially or completely evaporated during the coating operation. Thus, it is necessary to periodically recharge the evaporator source, which involves burdensome operations because the the vacuum chamber must be opened in order to introduce a new quantity of metal and then pumped out again to restore the vacuum. This problem can be solved by using high-capacity static sources which contain a large quantity of metal to be evaporated. But, with this solution, high heating power is necessary in order to evaporate that amount of metal, and monitoring the regularity of the evaporation rate as a function of time is difficult. These problems are particularly troublesome in the case of an extremely large quantity of metal, as well as in the case of a long operating period, for example, when the substrate is continuous and unwinds before one or several evaporation sources.

Continuous operation sources have already been used. For example, the metal to be evaporated may be a wire which supplies, as the operation progresses, a crucible heated by the Joule effect, by high frequency, or by any other means. The wire is melted as it arrives in the continuous liquid metal phase in the crucible, and it is the liquid mass which vaporizes. This system is currently used in the area of aeronautics for the deposition of a aluminum used to protect parts against corrosion, as well as in the manufacture of composite materials, for example, aluminum-carbon fibers. Japanese Pat. No. 120,876 describes a process of this type.

Although using wire makes possible the evaporation of large quantities of metal and long term operation without requiring too much heating capacity, this method causes problems when the metal used is magnesium. This metal has a very low boiling point (1107° C. under normal temperature and pressure conditions) and, under the vacuum evaporation conditions generally used in vapor phase deposit techniques, the liquid phase does not occur between the solid phase and the vapor phase. That means that the supply wire may not soak in a bath of melted metal, but is immediately vaporized once it comes into contact with the crucible or once its temperature is sufficiently high. The hot surface from which the vapor emission is produced is thus significantly reduced in relation to the one that can be obtained with the use of a liquid mass; the result is that the deposition speed is much slower.

Another factor to be taken into consideration is that magnesium wire is not a common product and that it would have to be custom manufactured. This would cause a significant increase in the cost of the finished product. This would be particularly unfortunate because the substrate (spread-out fibers made of carbon, silicon carbide or aluminum oxide in the case of composite materials, for example), which is, in fact, the main part of the finished product, would be less expensive than the matrix. Finally, the low mechanical resistance and the lack of rigidity of magnesium wire would significantly complicate the supply system.

These problems led to the origin of the idea to supply the evaporator sources with metals in the form of powder, granules or any other divided form permitting quasi-continuous supply. However, in the case of magnesium, the high vapor tension of this metal in the usual evaporation conditions of vapor phase deposition processes, as well as its low density (1.74 g/cc), cause upheaval and significant movements in the powder grains as soon as they are introduced into the heated crucible. These movements are most likely due to the abrupt formation of vapor when the grains are heated rapidly, because their heat generating capacity is 0.25 cal/g/°C. This abrupt formation of vapor transmits a significant amount of movement to the powder grains, and thess movements can be maintained by convection. Thus, the powder grains are rapidly ejected from the crucible, resulting in poor yield, yield being defined as the ratio between the quantity of metal evaporated and the quantity of metal introduced. This yield may be as low as approximately 1 to 2 percent. In addition, the grains ejected in this way may be projected onto the supply system and clog it in the relatively long term through coalescence of the ejected grains as well as condensation of metal vapor, which causes interruptions in production.

SUMMARY OF THE INVENTION

It is therefore an object of the present invention to solve these problems by providing a device for vacuum evaporation of a material which provides a very high yield (close to 100 percent) while eliminating the risks of clogging the crucible supply system.

More particularly, the invention relates to a material evaporation device, usable in a vacuum chamber comprising, in a known manner:

a crucible, means of introducing material in particles into the crucible, and means of causing evaporation of the material while it is in the crucible.

The above and other objects are achieved according to the present invention by providing a crucible that is closed and comprises, in one of its walls, at least one evaporation opening whose dimensions are sufficiently small so that the metal particles in the crucible cannot escape, and said means of introduction comprises a supply opening, different from the evaporation opening, included in a wall of the crucible and capable of being sealed at least partially for a specified period.

The word "particle" is used here in the most general sense of the word and designates the solid elements which constitute the material, which may be grains, balls, spheres, microspheres, chips, etc.

The dimensions of the evaporation opening are like those described above, i.e., sufficiently small so that only the vapor may escape, and not the particles. The latter have a given size grading, but upon arrival in the crucible their size decreases because a portion of the material evaporates. In addition, inside the crucible, these particles are driven by random movements. The dimensions of the evaporation opening are designed so that the majority of the particles in the crucible do not escape, even when their dimensions have been reduced by evaporation. Nonetheless, it is possible that a very slight proportion of the particles will have extremely small dimensions and that they may be still be able to escape. However, this will only occur for a very small quantity of the material and has practically no influence on the yield of the device.

In one wall of the crucible there may be included a window closed by a fine-meshed screen with the mesh having the dimensions described above: each mesh of the screen thus constitutes an evaporation opening.

According to another aspect of the invention, the means of introducing the material into the crucible comprises:

a valve movable between a closed position in which it seals the crucible supply opening and an open position, a reservoir located a certain distance from the crucible and equipped with an opening allowing passage of the material, means of guiding the material from the reservoir to the crucible, a closure movable between a closed position in which it closes the reservoir orifice and open position, and means of controlling the opening and closing of the valve and the closure.

In a first embodiment, the operating means is arranged in such a way so as to cause the simultaneous opening and closing of the valve and the closure. The reservoir is preferably located above the crucible so that the material flows under the influence of gravity from the reservoir to the crucible. In this first embodiment, said control means may comprise:

a mechanical link between the closure and the valve (which is a stopper), a rigid arm on which is mounted said closure, said arm capable of pivoting about an axis, and means of causing said arm to pivot.

Said pivoting means preferably comprise:

at least one electromagnet with a core movable between two positions, a rigid rod integral with this core and connected to a piece integral with the arm by means of an articulation located at a certain distance from the axis.

In a second embodiment, the control means are arranged in such a way that opening and closing of the valve are independent from opening and closing of the closure.

In this case, the control means comprise:

means of returning the valve to its open position, a first electromagnet having a core movable between a first position and a second position, a first mechanical link between the valve and the core of the first electromagnet, whereby energizing of the first electromagnet causes movement of both its core and the first mechanical link in a direction which causes the valve to close, means for returning the closure to its closed position, a second electromagnet different from the first, having a core movable between a first position and a second position, and a second mechanical link between the closure and the core of the second electromagnet, energizing of the second electromagnet causing movement of both its core and the second mechanical link in the direction which causes the closure to open.

Finally, according to a final aspect of the invention, the device also comprises:

a set of reflectors located on the exterior of the crucible around the evaporation opening in such a way as to direct the vapor emitted in a given direction, means of maintaining these reflectors at a temperature higher than the evaporation temperature of the metal.

BRIEF DESCRIPTION OF THE DRAWINGS

The invention will be better understood from the consideration of the ensuing description offered by way of non-limitative example, and from the attached drawings where.

DETAILED DESCRIPTION OF THE PREFERRED EMBODIMENTS

Figure 1:
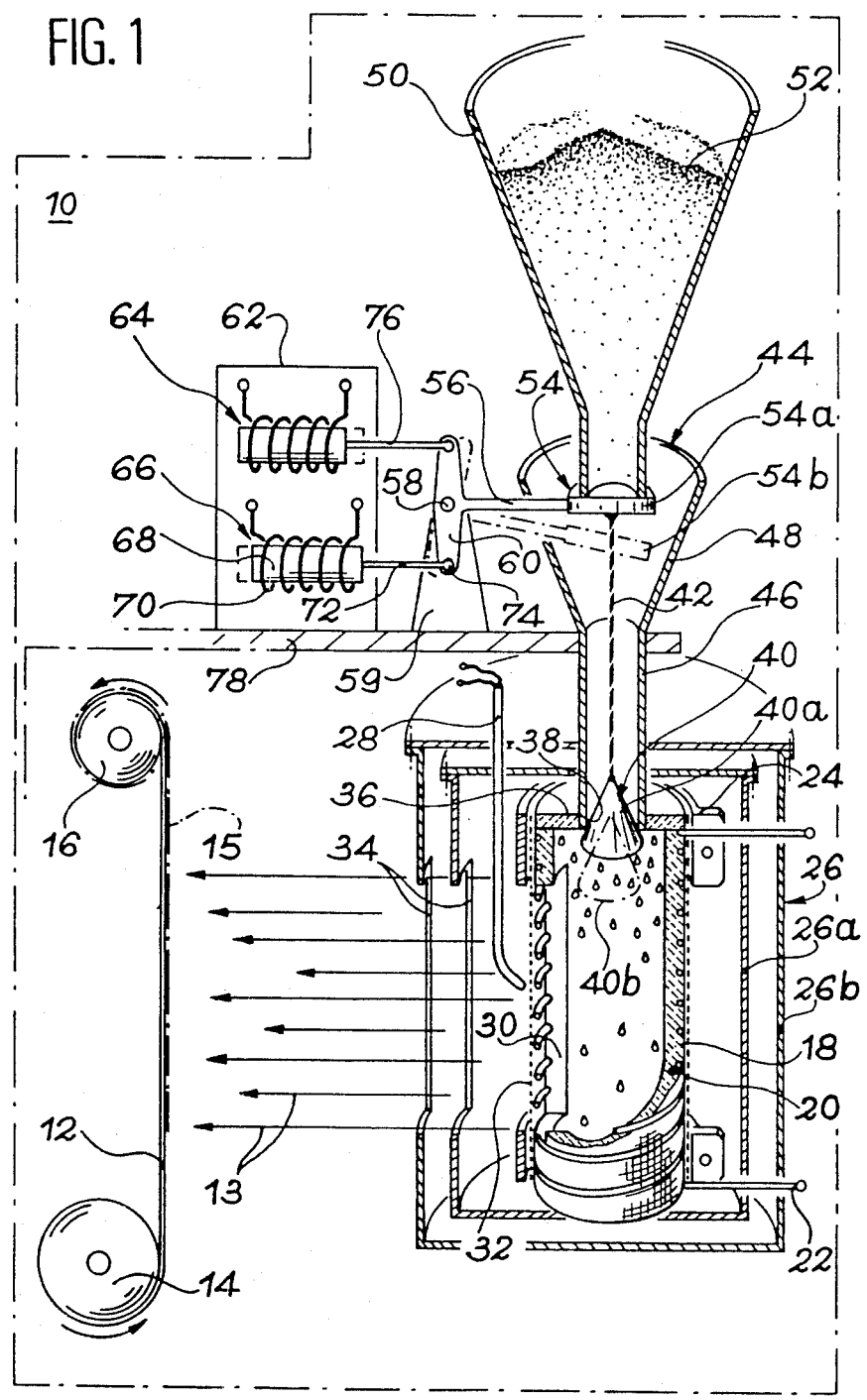
FIG. 1 is a schematic view in vertical section of a first embodiment of the device in accordance with the invention.

FIG. 1 shows a chamber 10 illustrated schematically by dot and dash lines, within which a vacuum has been created. The substrate 12 to be coated may be, for example, a strip that rolls from a supply reel 14 to a take-up reel 16. Inside the chamber is located the evaporation device which is the subject of this invention. It comprises first a crucible 18 which may be cylindrical in shape and located vertically on a support (not shown). The crucible is located at the same level as the portion of substrate 12 (which is to be coated) between reels 14 and 16. Crucible 18 is heated by any known means, for example, a resistor 20 connected to an electrical supply (not shown) by wires such as 22. If necessary, the crucible is held by clamp fittings 24 located at its upper and lower portions. It may be surrounded by one or more reflectors 26 whose role is to diminish losses by radiation. In the example described herein, there are two reflectors 26a and 26b each in the form of cylindrical sleeve with a reflective internal wall. These reflectors are arranged concentric to the crucible. A thermocouple 28, located in the space between internal reflector 26a and the crucible and disposed in such a manner that its end is in contact with the crucible, makes it possible to determine the temperature of the crucible. Reflectors 26 are prerferably closed at their upper and lower ends in order to limit heat loss.

It will also be seen from FIG. 1 that the crucible wall is equipped with a window closed by a fine-meshed screen 32, the arrangment being such that this screen faces the substrate to be coated 12. The role of this screen is to allow passage of the metal vapor while preventing passage of the solid metal grains, as will be seen below when the operation of the equipment is described. To do this, screen mesh 32 has dimensions smaller than those of the smallest grains in the crucible. Reflectors 26 also comprise windows 34 opposite screen 32 in order to allow passage of the metal vapor.

Crucible 18 is closed at its uppermost part by a wall 36 equipped at its center with a round opening 38. The latter may be sealed by a stopper or valve 40 movable between a closed position 40a and an open position 40b (shown in phantom lines). This stopper is operated by means of a cable 42, whose operation will be described below. Stopper 40 is cone shaped and is located inside the crucible. The diameter of opening 38 is smaller than the diameter of the cone comprising the stopper. Thus, when the latter is raised from inside the crucible by means of cable 42, at a certain point thee stopper is blocked agaist opening 38. thus closing the crucible.

Above this opening and outside of the crucible is located a first funnel 44 comprised of a cylindrical part 46 topped by a widened part 48. The lower part of the cylindrical part of chute 46 is fixed in an impervious manner to uppper wall 36 of the crucible around opening 38. In the example described herein, the lower part of the chute 46 is located at exactly the level of opening 38, but alternative embodiments would include the chute 46 penetrating to a greater or lesser degree into the crucible. Stopper 40 would then be located in such a manner as to seal the end of this chute. In any case, orifice 38 would have to be closed in an impervious manner in order to prevent passage of the vapor or grains of metal at that location. Cable 42 is located substantially along the axis of funnel 44.

A second funnel 50 containing the metal powder 52 is located above the first funnel 44. This second funnel 50 is kept inside chamnber 10 by an appropriate mounting means which, for the sake of clarity, has not been shown. Funnel 50 is closed on a lowermost portion by a closure means such as plate 54 mounted at one end of a rigid arm 56 able to pivot around a horizontal axis 58. The latter is mounted on a support 59 fixed in relation to chamber 10. At the end of arm 56, opposite plate 54, is fixed another arm (or lever) 60 perpendicular to arm 56 in such a way that it is the combination of the two arms 56 and 60 which can pivot around axis 58. The two arms 56 and 60 may form a single T-shaped part. Thus, plate 54 is movable between closed position 54a, shown by solid lines in the drawing, and open position 54b, shown by phantom lines. This open position is obtained after pivoting set 54, 56, 60 at a certain angle around axis 58, in a clockwise direction in the drawing.

Cable 42 has a first end fixed to the upper part of stopper 40 and its other end fixed to the lower surface of plate 54. Its length is such that, when plate 54 is in closed position 54a, stopper 40 is in closed position 40a and, when plate 54 is in open position 54b, stopper 40 is in open position 40b.

Arms 56 and 60, and thus plate 54 and stopper 40, are operated by means of a control device 62 which comprises two superposed electromagnets, i.e., an upper electromagnet 64 and a lower electromagnet 66. Each of these electromagnets, for example, lower electromagnet 66, is comprised essentially of a cylindrical core 68 surrounded by a coil 70. Core 68 is movable longitudinally and it is linked to arm 60 by rigid rod 72. The latter is preferably located along the axis of core 68. The link between rod 72 and arm 60 is a joint 74. In the same way, the core of electromagnet 64 is connected by a rod 76 to arm 60 at a point situated above axis 58. Control device 62, as well as support 59 of axis 58, rests on a support 78 located inside chamber 10.

The chamber may be equipped with an opening allowing passage of the lower part 46 of funnel 44 therethrough, which makes it possible to mount the latter. However, it would still be within the scope of the invention to use other means to hold funnel 44. At any rate, it is preferable that the link between the funnel 44 and the upper wall 36 of the crucible be sealed so that the solid metal grains contained in the crucible do not escape through opening 38.

The operation of the device illustrated in FIG. 1 will now be described below.

First, a vacuum is created in chamber 10 and the heating resistor 20 is powered so that the crucible will reach a temperature allowing evaporation of the metal to be deposited on the substrate. Initially, valve 40 and plate 54 are in closed positions 40a, 54a on the substrate. In that position, the joints of rode 72 and 76 on arm 60 are located on the same vertical line and, in the example described herein, they are at equal distance from axis 58. The result is that, in this position, arm 56 is horizontal and arm 60 vertical. In addition, in that position the coils supplying the electromagnets 64 and 66 are energized in such a way that the core of the upper electromagnet is pushed toward the left in the illustration and the core 68 of electromagnet 66 is pushed toward the right in the illustration.

When a certain quantity of metal is to be introduced into the crucible, the coils of the electromagnet are energized in such a way that the core of electromagnet 64 is pushed toward the right and the core of electromagnet 66 is pushed toward the left. In this way, rods 76 and 74 move horizontally toward the right and toward the left, respectively. This causes plate 54 and arms 56 and 60 to pivot about axis 58, which puts plate 54 in open position 54b. This also has the effect of moving stopper 40 into open position 40b. Thus, a certain quantity of metal powder 52 leaves funnel 50 from its lower part and falls into funnel 44. Since opening 38 is at least partially unblocked, the powder falls into the crucible where it is heated rapidly to its boiling temperature. After a certain period of time, determined according to the quantity of powder which is to be introduced into the crucible at each cycle, the electromagnet coils are supplied in the opposite direction or de-energized, in such a way that the core of electromagnet 64 is once again pushed toward the left and that the core of electromagnet 66 is once again pushed toward the right. This has the effect of causing plate 54 and arms 56 and 60 to pivot about axis 58 counterclockwixe in the illustration. Plate 54 is thus returned to its closed position 54a, and stopper 40 to its closed position 40a.

The mass of metal powder thus introduced into the crucible is brought quite rapidly to a sufficient temperature for the metal to vaporize. The vapor thus produced escapes from the crucible through screen 32 under the influence of the pressure differential between the crucible and the chamber. This pressure differential results from the formation of vapor inside the crucible while the chamber is in a vacuum. The crucible, as well as reflectors 26, is oriented in such a way that the vapor is directed toward the substrate 12, symbolized by arrows 13, and is deposited on the substrate, forming a layer 15 shown schematically by dot and dash lines in FIG. 1. Of course, the winding of substrate 12 was controlled before the initial introduction of the powder into the crucible.

Figure 2:
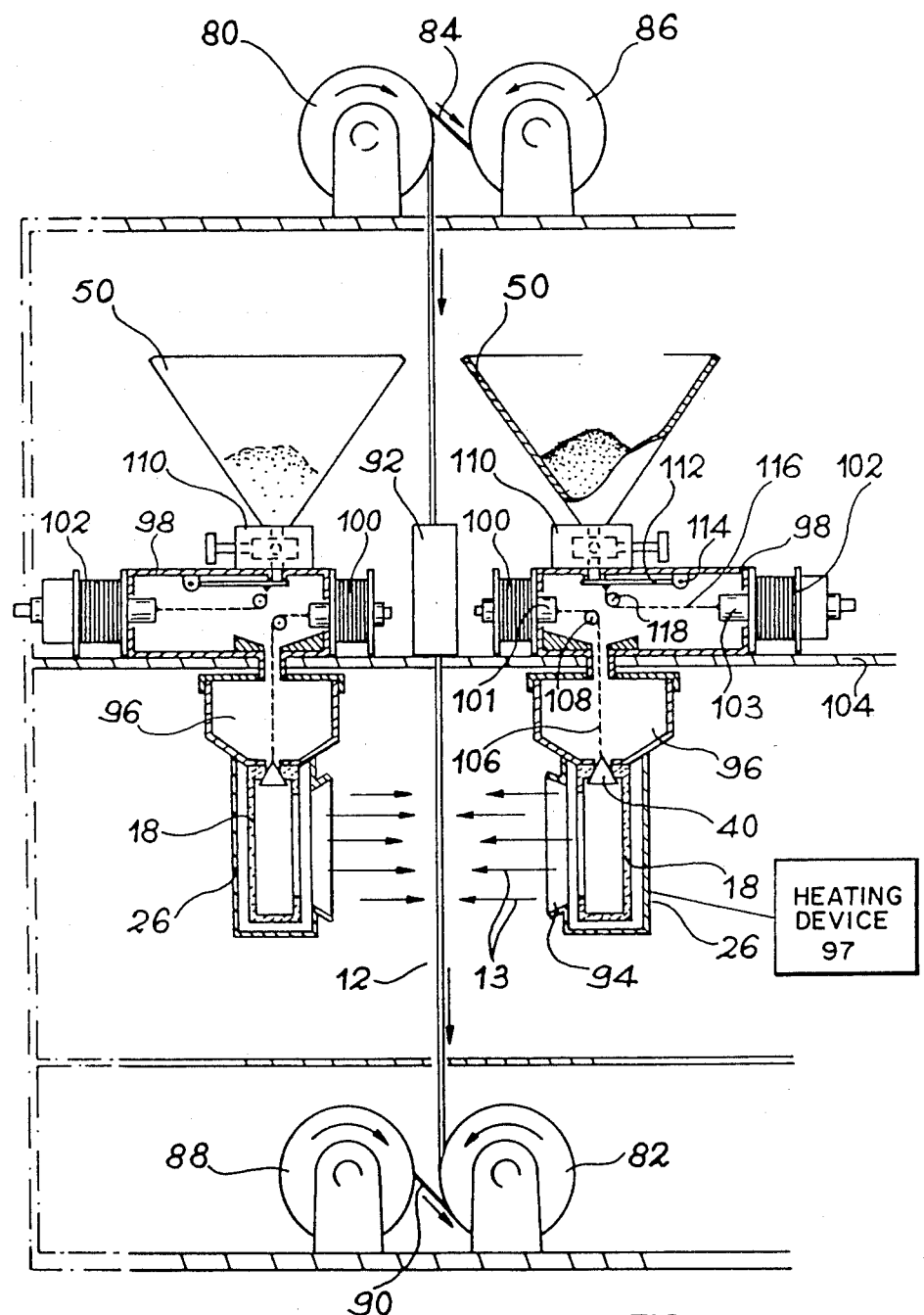
FIG. 2 is a schematic view in vertical section of a second embodiment of the invention.

FIG. 2 illustrates another embodiment of the device in accordance with the invention. For the sake of clarity, the elements identical to those of FIG. 1 have the same reference numbers. Substrate 12 (for example a carbon fiber) will be seen which is fed out by supply reel 80 and rolls onto take-up reel 82. The aluminum paper 84 protecting the virgin fiber is rolled onto a reel 86 while reel 88 feeds out the aluminum paper used to protect the impregnated fiber. Substrate 12 passes into an outgassing furnace 92 before arriving at crucible level.

In the example described herein, there are two devices in accordance with the invention, located on either side of the substrate, in order to coat uniformly. Of course, the scope of the invention would not be exceeded by using any number of such devices, their location being distributed according to the type of coating desired. Since the two devices are identical, only one of them will be described.

Crucible 18 is surrounded by one or several reflectors 26 for heat protection. Crucible 18 and reflectors 26 possess windows allowing passage of the vapor (arrows 13). A set of reflectors 94 may advantageously be included located on the exterior of the crucible and in such a way as to direct the vapor toward the substrate. A heating device 97 enables reflectors 94 to be maintained at a temperature higher than the evaporation temperature of the material. In this way the vapor emitted is properly directed toward the substrate, which improves the coating yield. Of course, reflectors such as 94 may be also be used with the embodiment shown in FIG. 1.

Crucible 18 comprises an opening in its upper part allowing it to communicate with a chamber 96. The chamber communicates, at its upper part, with the interior of a housing 98. Two electromagnets 100 and 102, whose role will be described below, are fixed on the walls of housing 98. The housing as well as the two electromagnets are located on a support 104 inside the vacuum chamber. Chamber 96 and crucible 19 are located under support 104.

The opening in the upper part of crucible 18 may be sealed by a conical stopper 40. The stopper is connected, by means of a cable 106 passing over a pulley 108, to core 101 of electromagnet 100.

The funnel-shaped powder reservoir 50 is located outside housing 98 and above it. It is equipped at its lower part with a magnesium supply stop system 110 and communicates with the interior of housing 98 by means of an opening which can be sealed by a valve 112. This valve may pivot about an axis 114 and it is connected by a cable 116 passing over a pulley 118 to core 103 of electromagnet 102. A return spring (not shown) returns valve 112 to closed position. The openings causing reservoir 50 to communicate with housing 98, housing 98 with chamber 96 and the chamber with crucible 18 are preferably located on the same vertical line.

The device illustrated in FIG. 2 operates as follows:

Initially, stopper 40 and valve 112 are in closed poistion, i.e., cores 101 and 103 of electromagnets 100 and 102 are moved toward the left in FIG. 2. In this situation electromagnet 100 is energized and electromagnet 102 is not. Stopper 40 may be moved into open position by a return spring (not shown). When a certain quantity of powder is to be introduced into the crucible, electromagnet 102 is activated: core 103 moves to the left in the illustration and cable 116 causes valve 112 to open by pivoting in opposition to the force exercised by its return spring.

Electromagnet 100 is then de-energized so that core 101 moves toward the right in the right side illustration, causing stopper 40 to open under the effect of its return spring. After desired quantity of powder has been introduced into the crucible, electromagnet 102 is de-energized and the return spring of valve 112 returns it to closed position. After the last particles have fallen into the crucible, electromagnet 100 is energized so that core 101 moves back toward the left in the illustration, which has the effect of returning stopper 40 to the closed position. The cycle is resumed after a specific amount of time has elapsed.

This method of operation, and particularly the fact that stopper 40 closes after valve 112 does, allows all of the material removed from reservoir 50 to be introduced into the crucible and prevents particles from remaining in the intermediate elements.

Several examples will now be described of coatings which have been applied with the use of a device in accordance with the invention and with the use of devices known from the prior art.

EXAMPLE 1

A device like the one shown in FIG. 1 has been used as the evaporator source for magnesium in equipment capable of manufacturing "prepreg", i.e., a constituted fibrous semi-processed product made, in this example, of carbon fibers that are spread out and then covered with magnesium by PVD (physical vapor deposition). The grains of magnesium powder used were nearly spherical and had an average diameter of 0.5 mm.

Other tests were carried out varying the experimental conditions. Various powders were used with average diameters between 0.3 and 2.5 mm; since the shape of the grains was random, different supply rates were used up to 5 grams per minute, the crucible temperature being between 500° and 700° C. and the interior pressure of the crucible being between 1.35 and $1.35 \times 10^{-4}$ ($10^{-2}$ to $10^{-6}$ torr).

In all cases, the yield between the quantity of evaporated metal and the quantity introduced into the crucible was found to be close to 100%. No loss of powder was noted, which indicates that all of the powder was transformed into vapor.

Such a device may be operated for as long as is desired, and it does not stop until all of substrate 12 has passed before crucible 18 or until the powder reserve in funnel 50 has been used up. After dismantling, no metal deposits or clogging was found on the level of supply valve 40 or chute 46. In this way several hundred meters of prepreg made of carbon fibers coated with magnesium were manufactured without any maintenance of the evaporation systems and at a high production rate.

EXAMPLE 2

In this example, it was attempted to coat the carbon fibers with magnesium under the same conditions as in Example 1, but while using an open crucible, i.e., by eliminating screen 32. It was noted that each time powder arrived in the crucible, the powder immediately passed through opening 30 after having produced very little vapor. The yield between the quantity of metal evaporated and the quantity introduced into the crucible was so low that it could hardly be measured.

EXAMPLE 3

In this example, it was attempted to repeat the same tests as in Example 1, retaining screen 32, but eliminating supply valve 40. It was noted that, under theses conditions, the powder poured into the crucible is immediately sent toward supply opening 38. One portion of the powder cakes around the crucible inlet or at the level of chute 46 according to the temperature whereas the other portion, falling back into the crucible, is immediately returned by the emission of a new vapor flow. After a period of time that varied according to the supply rate, the temperature, and the geometry of the device (this period varying between a few minutes and several hours), supply chute 46 became clogged. Disassembly and cleaning are thus necessary before resuming production. During the operating period, the yield between the quantity of metal evaporated and the quantity introduced into the crucible is approximately 10 to 50 percent.

It will be seen that the device in accordance with the invention have particularly beneficial advantages in comparison with devices of prior art where the primary aim is to obtain a very high yield, generally close to 100 percent, and at any rate greater than 50 percent. This results both from the fact that the crucible is closed by supply valve 40 once the desired quantity of powder is introduced and from the fact the screen 32 has openings of a very small diameter allowing passage of the vapor and preventing passage of the grains. Thus, all of the metal contained inside the crucible is evaporated and escapes through screen 32 and, even if there are movements within the crucible due to the creation of vapor, the grains do not rise through opening 38 or along chute 36 because of stopper 40. Since the grains are kept within the crucible, where the temperature is maintained at a level allowing evaporation of the metal, there cannot be any condensation on the crucible walls and therefore any risk of clogging is eliminated. In addition, since the crucible is supplied intermittently, and quantity of metal introduced during each opening can be regulated at will.

In addition, since the crucible is closed, the parts of the device in contact with the metal powder, i.e., essentially funnels 44 and 50 and plate 54, are at a temperature lower than that of the crucible, and thus at a temperature lower than that capable of causing evaporation of the metal. This condition is necessary, because, if it were not fulfilled, caking of the particles would hamper their transfer toward the crucible.

Finally, it is obvious that the invention is not limited only to the embodiments which have been described above, but that modifications may be made that fall within the scope of the invention. Thus, one skilled in the art may vary the shape and dimensiosn of the crucible, as well as its heating means, and/or vary the number of reflectors as a function of the conditions of usage. As for the means of supplying the crucible with metal powder, although two simple and practical embodiments have been described, it would still fall within the scope of the invention to use another supply system, as long as it allows the crucible to be supplied intermittently. Any appropriate means may also be used to fix or maintain the different elements of the device inside the chamber, particularly the crucible, the reflectors, the funnels, and the control system of plate 54.

Finally, this device can be used regardless of whether the metal is in the form of powder, granules, balls, or chips. It may be used for any metal to be deposited and for any substrate, for example, a fibrous prepreg comprises of multistranded carbon or silicon carbide fibers previously spread out, then vapor deposited.

I claim:

1. Apparatus for evaporation of a metal in a vacuum chamber, said apparatus comprising:
    a crucible wherein the crucible includes in one of its walls, at least one evaporation opening having dimensions that are sufficiently small so that metal particles in the crucible cannot escape, said evaporation opening comprises a window closed by a screen, said screen having a mesh with dimensions that are sufficiently small so that the metal particles in the crucible cannot pass through said mesh;
    means for introducing metal particles into the crucible wherein said means for introducing comprises a supply opening, different from said evaporation opening, located in a wall of the crucible and means for at least partially sealing said supply opening during a specified length of time, said means for at least partially sealing said supply opening comprises a valve movable between a closed position in which it seals the supply opening of said crucible and an open position;
    wherein said means for introducing the metal into the crucible comprises;
    a reservoir located a distance from said crucible and having an opening allowing passage of said metal particles;
    means for guiding the metal particles from said reservoir to said crucible;
    a closure means movable between a closed position in which it closes said reservoir opening and an open position in which it does not close said reservoir opening; and
    means for controlling the opening and closing of said valve and said closure means; and
    means for causing evaporation of the metal particles in the crucible.

2. The apparatus of claim 1, wherein said means for controlling includes means for causing simultaneous opening and closing of said valve and said closure means.

3. The apparatus of claim 2, wherein the closure means is located above the valve, said means for controlling comprising:
    a mechanical link between the closure means and the valve;
    a rigid arm on which is mounted said closure means, said arm pivotally mounted for movement about an axis; and
    means for causing said rigid arm to pivot.

4. The apparatus of claim 3, wherein said means for causing comprises:
    at least one electromagnet having a core movable between two positions; and
    a rigid rod integral with said core and connected to a lever integral with the arm by means of a joint located at a certain distance from said axis.

5. The apparatus of claim 1, wherein said controlling means includes means for controlling the opening and closing of the valve independent from the opening and closing of the closure means.

6. The apparatus of claim 5, wherein said controlling means comprises:
    means for returning said valve toward its open position;
    a first electromagnet having a core movable between a first position and a second position during energization:
    a first mechanical link between said valve and said first electromagnet core, the energizing of said first electromagnet comprising means for causing the movement of said core and said first mechanical link in the direction causing said valve to close;
    means for returning said closure means to a closed position;
    a second electromagnet having a core movable between a first position and a second postion; and a second mechanical link between the closure means and said second electromagnet core, energizing of said second electromagnet comprising means for causing said second mechanical link to move in a direction causing said closure means to open.

7. Apparatus for evaporation of a metal in a vacuum chamber, said apparatus comprising:

a crucible wherein the crucible includes in one of its walls, at least one evaporation opening having dimensions that are sufficiently small so that metal particles in the crucible cannot escape;

means for introducing metal particles into the crucible wherein said means for introducing comprises a supply opening, different from said evaporation opening, located in a wall of the crucible and means for at least partially sealing said supply opening during a specified length of time; and means for causing evaporation of the metal particles in the crucible, said apparatus further including:

reflector means, located on an exterior of said crucible around said evaporation opening, for directing vapor emitted from said crucible in a specified direction; and means for maintaining said reflector means at a temperature higher than an evaporation temperature of said metal particles.

* * * * *